United States Patent [19]
Ulmer et al.

[11] Patent Number: 4,544,854
[45] Date of Patent: Oct. 1, 1985

[54] ANALOG SWITCH STRUCTURE HAVING LOW LEAKAGE CURRENT

[75] Inventors: Richard W. Ulmer; James A. McKenzie, both of Austin, Tex.

[73] Assignee: Motorola, Inc., Schaumburg, Ill.

[21] Appl. No.: 520,361

[22] Filed: Aug. 4, 1983

[51] Int. Cl.[4] .................... H03K 17/16; H03K 17/687
[52] U.S. Cl. .................... 307/576; 307/243; 307/572; 307/579; 307/554
[58] Field of Search ............... 307/443, 496, 451–453, 307/352–353, 243, 572, 575–577, 579, 584, 585, 546, 553, 554

[56] References Cited

U.S. PATENT DOCUMENTS

| 3,521,141 | 7/1970 | Walton | 307/570 X |
| 3,720,848 | 3/1973 | Schmidt, Jr. | 307/579 |
| 4,066,919 | 1/1978 | Huntington | 307/353 |
| 4,181,862 | 1/1980 | Dingwall | 307/200 B X |
| 4,311,930 | 1/1982 | Chan et al. | 307/575 |
| 4,446,390 | 5/1984 | Alaspa | 307/579 |
| 4,495,629 | 1/1985 | Zasio et al. | 307/272 A X |

Primary Examiner—John S. Heyman
Assistant Examiner—D. R. Hudspeth
Attorney, Agent, or Firm—Anthony J. Sarli, Jr.; Jeffrey Van Myers; Robert L. King

[57] ABSTRACT

An analog switch structure which utilizes three switches and has low leakage current is provided. A first switch couples an input terminal to a node in response to a control signal. A second switch connects the node to an output terminal in response to the control signal. A buffer circuit is connected to the output terminal for providing a buffered output signal. A third switch is connected between the buffered output signal and the node to selectively connect the buffered output signal to the node, thereby maintaining zero voltage potential across the second switch.

10 Claims, 2 Drawing Figures 4,544,854

ANALOG SWITCH STRUCTURE HAVING LOW LEAKAGE CURRENT

TECHNICAL FIELD

This invention relates generally to analog switches and, more particularly, to analog switches having compensation for leakage current.

BACKGROUND ART

Analog switches typically exhibit a leakage current at control electrode voltage levels below the threshold voltage of the transistors comprising the analog switch. The current which flows through the switch is proportional to the source-to-drain voltage of the transistors. This phenomenon is inherent from the current-voltage transfer curve of a transistor. In an analog switch having multiplexed inputs, an error in the input voltage may result from leakage currents which are summed through the on impedance of a selected channel. Leakage currents in charge conservation circuits are further aggravated at higher temperature ranges.

SUMMARY OF THE INVENTION

It is an object of the present invention to provide an improved analog switch structure having low leakage current.

Another object of the present invention is to provide an improved analog transistor switch structure having a multiplexed input and substantially no leakage current at control electrode voltage levels below the threshold voltage level of the transistors.

Yet another object of the present invention is to provide an improved analog transistor switch structure exhibiting low leakage current over a wide temperature range.

In carrying out the above and other objects of the present invention, there is provided, in one form, an analog switch structure having a first switching means for coupling an input terminal to a node in response to a control signal. A second switching means is connected between the node and an output terminal for coupling the node to the output terminal in response to the control signal. A buffer means for providing a buffered output signal has an input connected to the output terminal. A third switching means for selectively connecting the buffered output signal to the node in response to a complement of the control signal is connected between the node and the output of the buffer means. Both the buffer means and the third switching means maintain the voltage potential across the second switching means at zero volts thereby providing low leakage current.

The above and other objects, features and advantages of the present invention will be more clearly understood from the following detailed description taken in conjunction with the accompanying drawings.

DETAILED DESCRIPTION OF THE PREFERRED EMBODIMENT

Figure 1:
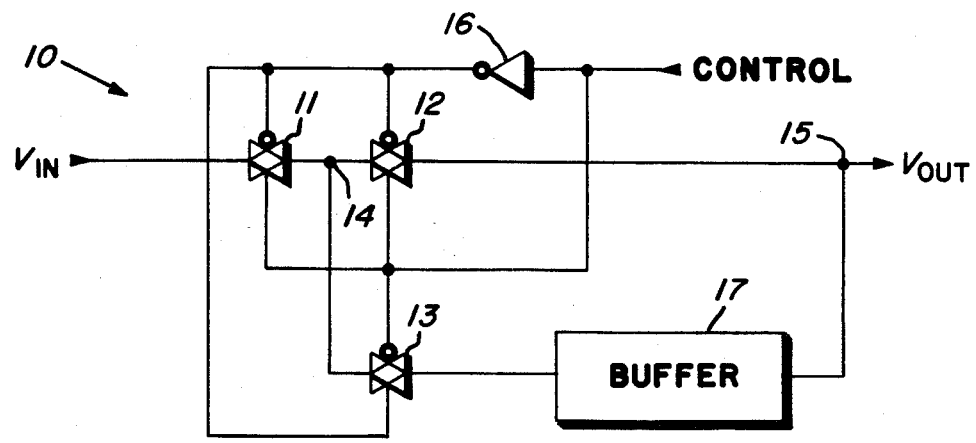
FIG. 1 illustrates in partial schematic form an analog switch structure in accordance with the present invention.

Shown in FIG. 1 is an analog switch structure 10 constructed in accordance with a preferred embodiment of the present invention. A switch 11 has a first terminal connected to an input terminal for receiving an input voltage, say $V_{IN}$. Switch 11 has a second terminal connected to a first terminal of both a switch 12 and a switch 13 at a node 14. A second terminal of switch 12 is connected to an output node 15 for providing an output voltage, say $V_{OUT}$. A control signal is coupled to an input of an inverter circuit 16, to a first control terminal of a first conductivity type of switch 13, to a first control terminal of a second conductivity type of switch 11, and to a first control terminal of the second conductivity type of switch 12. An output of inverter circuit 16 is connected to a second control terminal of the first conductivity type of switch 11, to a second control terminal of the first conductivity type of switch 12, and to a second control terminal of the second conductivity type of switch 13. An input of a buffer circuit 17 is connected to the output terminal 15, and an output of buffer circuit 17 is connected to a second terminal of switch 13. It should be apparent that switch structure 10 may be implemented by completely reversing the polarity of the control signal and its complement at the control terminals of all switches. In the preferred embodiment, switches 11, 12 and 13 are CMOS transmission gates which are clocked in a conventional manner by the control signal. Switches 11, 12 and 13 are preferably constructed to be conductive when both a control signal applied to a control input of the first conductivity type is at a low state and a control signal applied to a control input of the second conductivity type is at a high state.

In this configuration, switch 13 and buffer circuit 17 of analog switch structure 10 function to maintain the voltage potential across switch 12 at approximately zero in response to the control signal. Buffer circuit 17 buffers the output voltage at output terminal 15 to provide the same voltage at the output of buffer circuit 17 with a low output impedance. The input of buffer circuit 17 has a very high impedance. As a result, there are no leakage current or load effects at output terminal 15 due to buffer circuit 17. The control signal functions to either make both switches 11 and 12 conductive and switch 13 nonconductive or to make both switches 11 and 12 nonconductive and switch 13 conductive. When switches 11 and 12 are both conductive, whatever input voltage $V_{IN}$ which is coupled to the first terminal of switch 11 is coupled directly to the output terminal 15. When switches 11 and 12 are both nonconductive, no current will flow through switch 12 including no leakage current at subthreshold voltage levels since near identical voltage potentials exist at both the first and second terminals of switch 12. As a result of the configuration of analog switch structure 10, no subthreshold current leakage occurs at output terminal 15 with respect to temperature variation, and there is no degradation of input dynamic voltage range.

Figure 2:
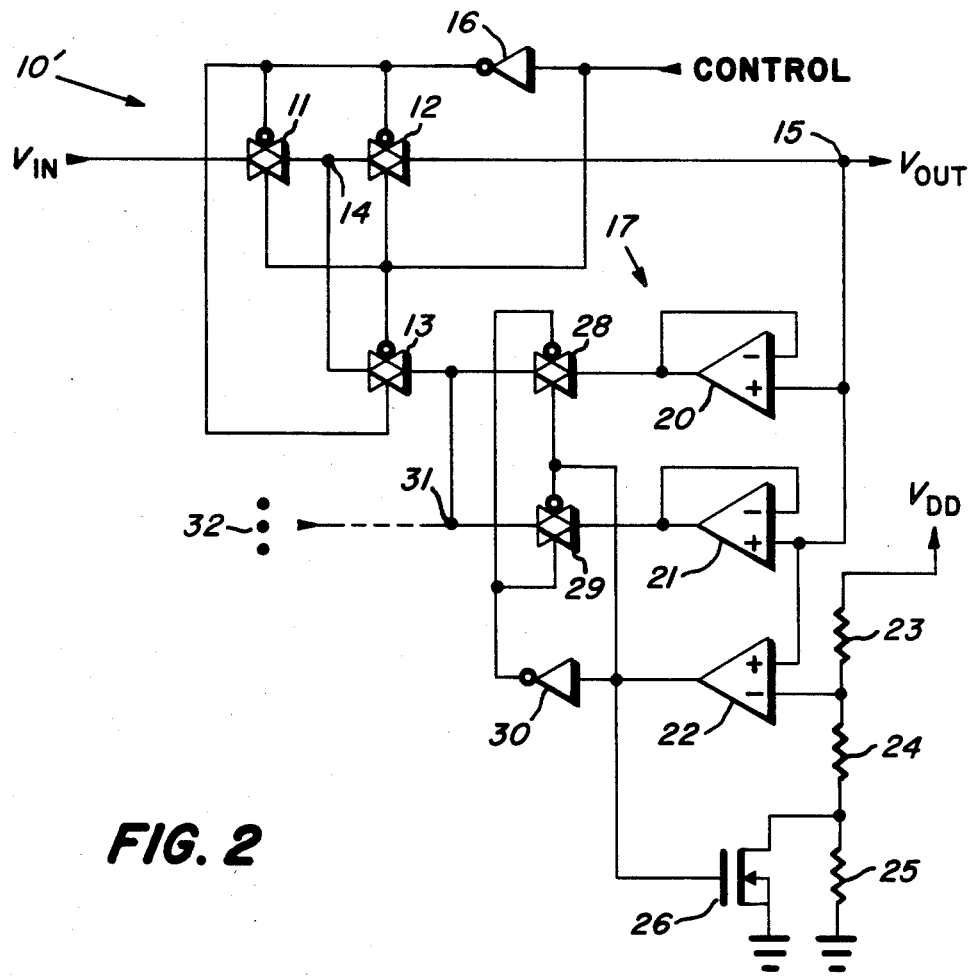
FIG. 2 illustrates in full schematic form an analog switch structure in accordance with the present invention.

Shown in FIG. 2 is a second embodiment of the present invention illustrating an analog switch structure 10' having a schematic embodiment of buffer circuit 17. Analog switch structure 10' is capable of multiplexing multiple input channels and functioning as a multiplexed analog switch as described below. Switches 11, 12 and 13, node 14, output terminal 15 and inverter 16 are connected the same as described previously in FIG. 1. Buffer circuit 17 comprises a differential amplifier 20 having a noninverting or positive input connected to output terminal 15. An inverting or negative input of differential amplifier 20 is connected to an output of differential amplifier 20 so that differential amplifier 20 is arranged in a noninverting configuration. A noninverting or positive input of a differential amplifier 21 is connected to output terminal 15. An inverting or negative input of differential amplifier 21 is connected to an output of differential amplifier 21 so that differential amplifier 21 is connected in a noninverting configuration. A comparator 22 has a noninverting or positive input connected to the output terminal 15, an inverting or negative input, and an output. A resistor 23 has a first terminal connected to a power supply voltage $V_{DD}$ and a second terminal connected to both the inverting input of comparator 22 and a first terminal of a resistor 24. A second terminal of resistor 24 is connected to both a first terminal of a resistor 25 and a drain electrode of an N-channel MOS transistor 26. Both a second terminal of resistor 25 and a source electrode of transistor 26 are connected to a ground potential. Transistor 26 has the substrate thereof connected to the source electrode to substantially reduce the effects of the conventional Body effect. The output of differential amplifier 20 is connected to a first terminal of a switch 28, and the output of differential amplifier 21 is connected to a first terminal of a switch 29. An output of comparator 22 is connected to an input of an inverter 30, to a control electrode of transistor 26, to a first control terminal of the second conductivity type of switch 28, and to a first control terminal of the first conductivity type of switch 29. A second control terminal of the first conductivity type of switch 28 is connected to both a second control terminal of the second conductivity type of switch 29 and an output of inverter 30. A second terminal of switch 29 is connected to both a second terminal of switch 28 and the second terminal of switch 13 at a node 31. Node 31 may receive other analog input channels as indicated by the dashed line so that analog switch structure 10 may be used for multiplex purposes to be described in greater detail below.

In this configuration, comparator 22 functions to switch the output of either differential amplifier 20 or differential amplifier 21 via switches 28 and 29, respectively, to the second terminal of switch 13 in response to the value of the voltage at output terminal 15. When the control signal is at a high logic level, switches 11 and 12 are made conductive and couple input voltage $V_{IN}$ to output terminal 15. Switch 13 is simultaneously made nonconductive. When the control signal is at a low logic level, switches 11 and 12 are made nonconductive and switch 13 is made conductive. Therefore, analog switch structure 10' is turned off and buffer circuit 17 functions to prevent leakage current from the input terminal to output terminal 15. In a preferred form, differential amplifier 20 is fabricated having a differential pair of input transistors of a first conductivity type and differential amplifier 21 is fabricated having a differential pair of input transistors of a second conductivity type. For purposes of illustration only, assume that differential amplifier 20 has a pair of P-channel input transistors and that differential amplifier 21 has a pair of N-channel input transistors. Since both differential amplifiers 20 and 21 are in a unity gain feedback configuration and sense output voltage $V_{OUT}$, output voltage $V_{OUT}$ plus or minus some associated offset voltage appears at the output of both differential amplifiers 20 and 21. Since differential amplifier 20 has P-channel input transistors, differential amplifier 20 has a common mode range extending effectively to the most negative power supply voltage. Similarly, since differential amplifier 21 has N-channel input transistors, differential amplififer 21 has a common mode range extending effectively to the most positive power supply voltage. The output voltage of comparator 22 is a voltage which is fully shifted to logic voltage levels. Comparator 22 senses the common mode range of output voltage $V_{OUT}$ and selects the appropriate differential amplifier for the sensed common mode range. For example, when the value of the output voltage at output terminal 15 is greater than the value of the reference voltage present at the negative input of comparator 22, the output of comparator 22 is at a logic high level. Differential amplifier 20 operates within its common mode range and exhibits an output voltage which is approximately equal to the output voltage at output terminal 15. Due to the magnitude of the output voltage at output terminal 15, differential amplifier 21 may not be operating within its common mode range and may not be exhibiting a valid output voltage. A logic high level at the output of comparator 22 causes a logic low level to be present at the output of inverter 30, thereby making switch 28 conductive and switch 29 nonconductive and coupling the output of differential amplifier 20 to the second terminal of switch 13. However, if the value of the output voltage at output terminal 15 is less than the value of the reference voltage present at the negative input of comparator 22, the output of comparator 22 is at a logic low level and the output of inverter 30 is at a high logic level. Therefore, switch 29 is conductive and switch 28 is nonconductive thereby coupling the output of differential amplififer 21 to the second terminal of switch 13. Differential amplifier 21 operates within its common mode range in a manner analogous to differential amplifier 20 as explained above. The negative input of comparator 22 is biased at about a nominal midscale value of supply voltage $V_{DD}$ by resistors 23, 24 and 25 for establishing a trip point voltage of comparator 22. Comparator 22 switches logic state when the voltage at output terminal 15 makes a transition through the trip point. Some hysteresis is desireable and is provided by resistor 25 and transistor 26 which functions as a positive feedback element having limited gain. The purpose of the hysteresis is to reduce possible oscillation of the output of comparator 22 when the output voltage at output terminal 15 is near the trip point. Such oscillation could produce erratic switching between the outputs of differential amplifiers 20 and 21. In this configuration, buffer circuit 17 is operational for an analog input voltage range from a positive power supply to a negative power supply. It should readily be apparent that there are numerous circuit structures which may be substituted for the structural embodiment of buffer circuit 17 of FIG. 2.

To utilize analog switch structure 10' as a multiplexed analog switch, multiple input circuits indicated by dots 32 may be coupled to analog switch structure 10' at node 31. Each such input circuit would comprise three switches which are connected in an analogous manner to switches 11, 12 and 13 and which are controlled by separate control signals and which are coupled to individual input voltages. Such a multiplexed switch structure would comprise a plurality of switching channels, each of which displays no leakage current regardless of what value of input voltage is applied. By now it should be apparent that an analog switch having low leakage and which may have multiple multiplexed channels has been provided. Theoretically, if the same voltage potential is applied across the terminals of switch 12 by switch 13 and buffer circuit 17, the analog switch will have no leakage current.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An analog switch structure having low leakage current comprising:
   first switching means for coupling an input terminal to a node in response to a control signal means;
   second switching means connected to the node for coupling the node to an output terminal in response to said control signal means;
   buffer means having an input connected to the output terminal, and an output for providing a buffered output signal; and
   third switching means connected between the node and the output of the buffer means, inversely responsive to said control signal means, for connecting the buffered output signal to the node.

2. The analog switch structure of claim 1 wherein the first, second and third switching means are CMOS switches.

3. The analog switch structure of claim 1 further comprising a plurality of multiplexed input switch stages for coupling a predetermined one of a plurality of input voltages to the output terminal in response to a predetermined one of a plurality of control signal means, each of the input switch stages comprising:
   an input switch having a first terminal connected to a predetermined input voltage, a control terminal connected to a predetermined one of the control signal means, and a second terminal;
   an output switch having a first terminal connected to the second terminal of the input switch, a control terminal connected to the predetermined control signal means, and a second terminal connected to the output terminal; and
   a compensating switch having a first terminal connected to the first terminal of the output switch, a control terminal inversely responsive to the predetermined control signal means, and a second terminal connected to the output of the buffer means.

4. The analog switch structure of claim 1 wherein the buffer means comprise:
   first differential amplifier means having a first input coupled to the output terminal, and a second input and an output connected together;
   second differential amplifier means having a first input coupled to the output terminal, and a second input and an ouput connected together;
   reference voltage means for providing a predetermined reference voltage;
   comparator means having a first input coupled to the output terminal, a second input coupled to the reference voltage means, and an output, for comparing the magnitude of the voltage at the output terminal with the reference voltage;
   fourth switching means having a first terminal coupled to the output of the first differential amplifier, a second terminal coupled to the second terminal of the third switching means, a first control terminal of the first conductivity type, and a second control terminal of the second conductivity type coupled to the output of the comparator means;
   fifth switching means having a first terminal coupled to the output of the second differential amplifier, a second terminal coupled to the second terminal of the third switching means, a first control terminal of the second conductivity type, and a second control terminal of the first conductivity type coupled to the output of the comparator means; and
   an inverter circuit having an input coupled to the output of the comparator means, and an output coupled to both the first control terminal of the fourth switching means and to the first control terminal of the fifth switching means.

5. The analog switch structure of claim 4 wherein the buffer means further comprise:
   hysteresis means coupled between the reference voltage means and a reference potential for providing hysteresis of the second input of the comparator in response to the output of the output of the comparator.

6. The analog switch structure of claim 5 wherein the hysteresis means comprise:
   a transistor having a first current electrode coupled to the reference potential, a control electrode coupled to the output of the comparator, and a second current electrode;
   a resistor having a first terminal coupled to the reference potential, and a second terminal coupled to both the second current electrode of the transistor and to the reference voltage means.

7. A method of substantially reducing the amount of leakage current in an analog switch structure, comprising the steps of:
   connecting first and second switches in series to selectively couple an input terminal to an output terminal in response to a control signal; and
   providing means to controllably maintain the voltage potential across the second switch at substantially zero volts in response to a complement of the control signal.

8. The method of claim 7 wherein maintaining the voltage potential across the second switch at substantially zero volts comprises the steps of:
   buffering the voltage at the output terminal; and
   selectively coupling the buffered output voltage to a node between the first and second switches.

9. A multiplexed analog switch structure having low leakage current comprising:
   first switching means for coupling an input terminal to a node in response to a control signal;
   second switching means connected to the node for coupling the node to an output terminal in response to said control signal;
   buffer means having an input connected to the output terminal, and an output for providing a buffered output signal;
   third switching means connected between the node and the output of the buffer means, inversely responsive to said control signal, for connecting the buffered output signal to the node; and
   a plurality of multiplexed input switch stages for coupling a predetermined one of a plurality of input voltages to the output terminal in response to a predetermined one of a plurality of control signals, wherein the first, second and third switching means and the buffer means comprise an input switch stage.

10. The analog switch structure of claim 9 wherein the buffer means comprise:

first differential amplifier means having a first input coupled to the output terminal, and a second input and an output connected together;

second differential amplifier means having a first input coupled to the output terminal, and a second input and an ouput connected together;

reference voltage means for providing a predetermined reference voltage;

comparator means having a first input coupled to the output terminal, a second input coupled to the reference voltage means, and an output, for comparing the magnitude of the voltage at the output terminal with the reference voltage;

fourth switching means having a first terminal coupled to the output of the first differential amplifier, a second terminal coupled to the second terminal of the third switching means, a first control terminal of the first conductivity type, and a second control terminal of the second conductivity type coupled to the output of the comparator means;

fifth switching means having a first terminal coupled to the output of the second differential amplifier, a second terminal coupled to the second terminal of the third switching means, a first control terminal of the second conductivity type, and a second control terminal of the first conductivity type coupled to the output of the comparator means; and an inverter circuit having an input coupled to the output of the comparator means, and an output coupled to both the first control terminal of the fourth switching means and to the first control terminal of the fifth switching means.

* * * * *